United States Patent
Yang et al.

(10) Patent No.: US 7,518,416 B2
(45) Date of Patent: Apr. 14, 2009

(54) METHOD AND APPARATUS FOR DETECTING SWITCHING CURRENT OF MAGNETIC DEVICE OPERATED IN CONTINUOUS CURRENT MODE

(75) Inventors: Ta-yung Yang, Milpitas, CA (US); Chuh-Ching Li, Taoyuan County (TW)

(73) Assignee: System General Corp., Taipei Hsien (TW)

( * ) Notice: Subject to any disclaimer, the term of this patent is extended or adjusted under 35 U.S.C. 154(b) by 4 days.

(21) Appl. No.: 11/763,138

(22) Filed: Jun. 14, 2007

(65) Prior Publication Data
US 2008/0309380 A1    Dec. 18, 2008

(51) Int. Cl.
*H03B 1/00* (2006.01)
*H03K 3/00* (2006.01)

(52) U.S. Cl. .......................... 327/110; 363/50; 363/76; 363/77; 363/78; 361/91.2

(58) Field of Classification Search .................. 363/50, 363/76–78; 361/91.2
See application file for complete search history.

(56) References Cited

U.S. PATENT DOCUMENTS

2006/0152203 A1 *   7/2006   Perry et al. ................. 323/283
2008/0170420 A1 *   7/2008   Yang et al. ..................... 363/50

* cited by examiner

*Primary Examiner*—Kenneth B Wells
*Assistant Examiner*—Daniel Rojas
(74) *Attorney, Agent, or Firm*—J.C. Patents

(57) ABSTRACT

The present invention provides a method and apparatus for detecting a continuous current of a switching current. A current signal is produced in response to a switching current of the magnetic device. By sampling the waveform of the current signal in response to the enabling of a switching signal, a first current signal and a second current signal are generated. A continuous current signal is produced according to the first current signal and the second current signal. The continuous current signal is corrected to the continuous current of the switching current.

10 Claims, 4 Drawing Sheets

METHOD AND APPARATUS FOR DETECTING SWITCHING CURRENT OF MAGNETIC DEVICE OPERATED IN CONTINUOUS CURRENT MODE

BACKGROUND OF THE INVENTION

1. Field of the Invention

The present invention relates to switching control circuit, and more particularly, to a switching control circuit of a magnetic device.

2. Description of Related Art

Switching control circuits have been widely used in power conversion. FIG. 1 shows a power converter including a controller 50 for generating a switching signal $S_W$ to regulate the output of the power converter in response to a feedback signal $V_{FB}$. The switching signal $S_W$ drives a power transistor 20 for switching a transformer 10. The transformer 10 is connected to an input voltage $V_{IN}$ of the power converter. The energy of the transformer 10 is transferred to the output voltage $V_O$ of the power converter through a rectifier 40 and a capacitor 45. A resistor $R_S$ is connected in series with the power transistor 20 to generate a current signal $V_I$ in response to a switching current $I_P$ of the transformer 10. The current signal $V_I$ is coupled to the controller 50 to control the power converter. The power converter may be operated in a discontinuous current mode (DCM) when the magnetic device such as the transformer 10 is fully discharged before the start of the switching cycle. If the switching signal $S_W$ is enabled before the transformer 10 is fully discharged, the power converter may be operated in a continuous current mode (CCM). A continuous current may be retained in the transformer when the power converter operated in the CCM. FIG. 2 shows a CCM waveform of the switching current $I_P$, in which the continuous current $I_A$ represents the energy stored in the transformer 10. A current $I_B$ is the energy that is further charged into the transformer 10 during the on time TON of this switching cycle. The continuous current $I_A$ stands for a major energy transfer of the transformer 10. The object of the present invention is to develop a method and apparatus to measure the continuous current $I_A$ of the switching current $I_P$.

SUMMARY OF THE INVENTION

The present invention provides a method and apparatus for detecting a continuous current of a switching current. A switching control circuit generates a switching signal to switch a magnetic device. The switching signal includes a minimum on time. A current sense circuit is coupled to generate a current signal in response to a switching current of the magnetic device. A signal generation circuit is developed to generate a first sample signal and a second sample signal in response to the enabling of the switching signal. A detection circuit is coupled to the current signal to generate a first current signal and a second current signal in response to the first sample signal and the second sample signal respectively. A continuous current signal is produced in the detection circuit according to the first current signal and the second current signal. The continuous current signal is corrected to the continuous current of the switching current. The level of the continuous current signal is equal to the first current signal minus the differential of the first current signal and the second current signal.

BRIEF DESCRIPTION OF THE DRAWINGS

The accompanying drawings are included to provide further understanding of the invention, and are incorporated into and constitute a part of this specification. The drawings illustrate embodiments of the invention and, together with the description, serve to explain the principles of the invention.

DESCRIPTION OF THE PREFERRED EMBODIMENTS

Figure 1:
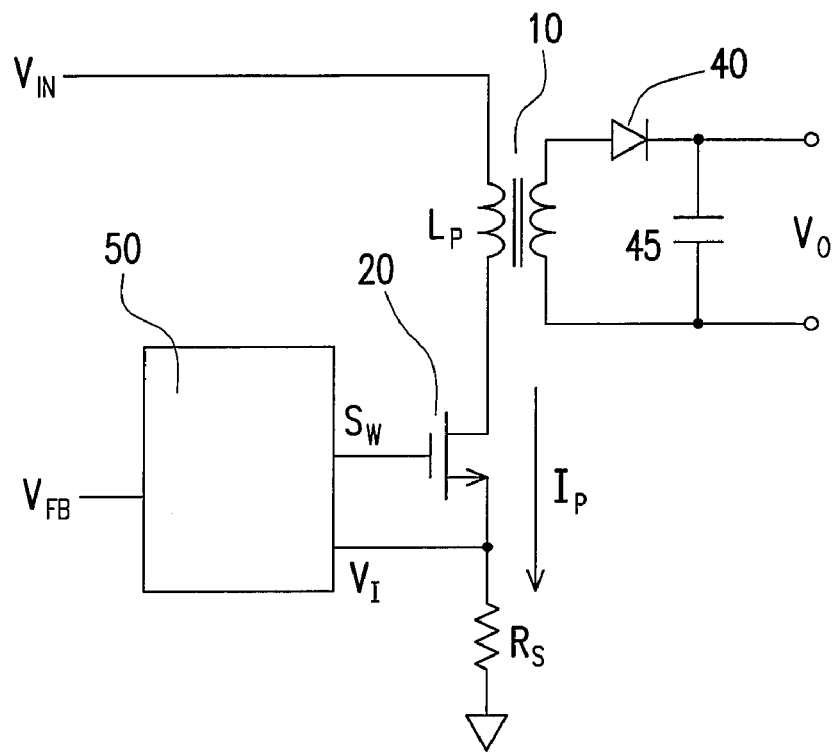
FIG. 1 shows a circuit diagram of a power converter.
Figure 2:
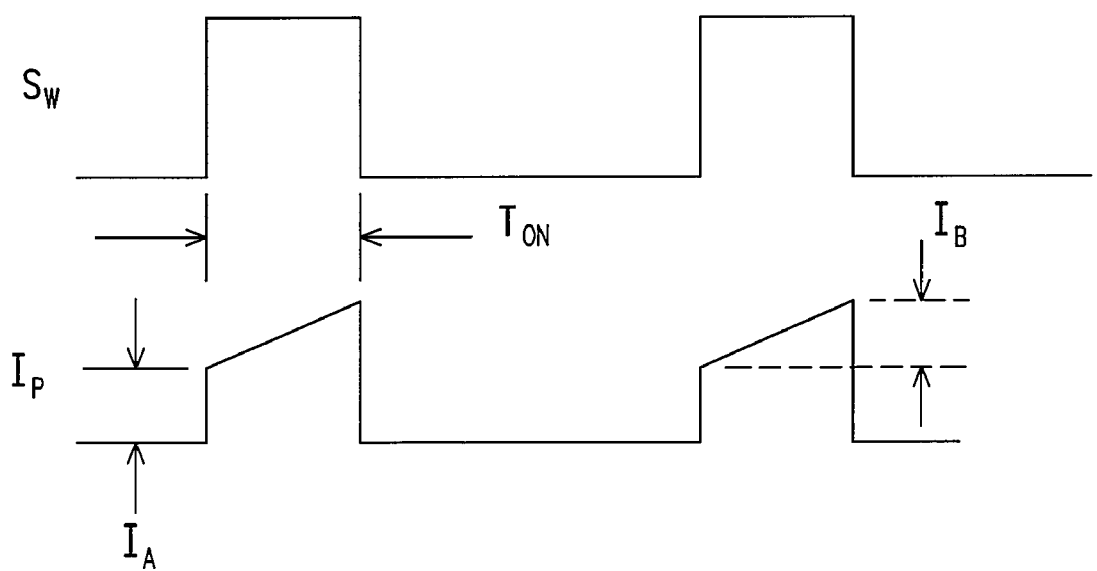
FIG. 2 shows switching current waveform operated in a continuous current mode.
Figure 3:
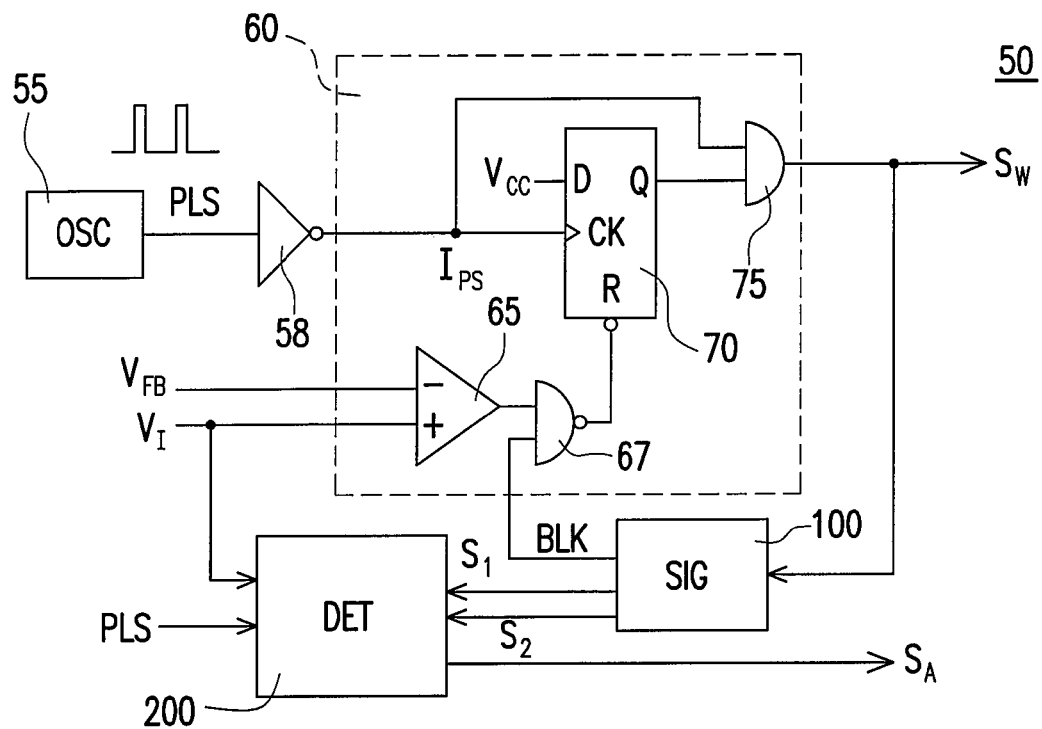
FIG. 3 is a view of a controller according to an embodiment of the present invention.

FIG. 3 shows the circuit of the controller 50, which includes a switching circuit 60 for generating the switching signal $S_W$ in response to a signal $I_{PS}$. An oscillation circuit 55 is developed to generate an oscillation signal PLS. The oscillation signal PLS is connected to an inverter 58 to generate the signal $I_{PS}$. The switching circuit 60 includes a flip-flop 70, an NAND gate 67, an AND gate 75 and a comparator 65. The flip-flop 70 is utilized to generate the switching signal $S_W$ through the AND gate 75. The input of the AND gate 75 is connected to the output of the flip-flop 70. Another input of the AND gate 75 is connected to the signal $I_{PS}$ to limit the maximum on time of the switching signal $S_W$. The flip-flop 70 is enabled in response to the signal $I_{PS}$. The switching signal $S_W$ is coupled to a signal generation circuit 100 to generate a blanking signal BLK and sample signals $S_1$ and $S_2$ in response to the switching signal $S_W$. The blanking signal BLK ensures a minimum on time of the switching signal $S_W$ when the switching signal $S_W$ is enabled. The blanking signal BLK is connected to the input of the NAND gate 67. The output of the NAND gate 67 is coupled to reset the flip-flop 70. Another input of the NAND gate 67 is connected to the output of the comparator 65. The positive input of the comparator 65 is coupled to receive the current signal $V_I$. The negative input of the comparator 65 is coupled to receive the feedback signal $V_{FB}$ for the feedback loop control. Furthermore, a detection circuit 200 is coupled to receive the current signal $V_I$, the oscillation signal PLS, and sample signals $S_1$ and $S_2$ to generate a continuous current signal $S_A$.

Figure 4:
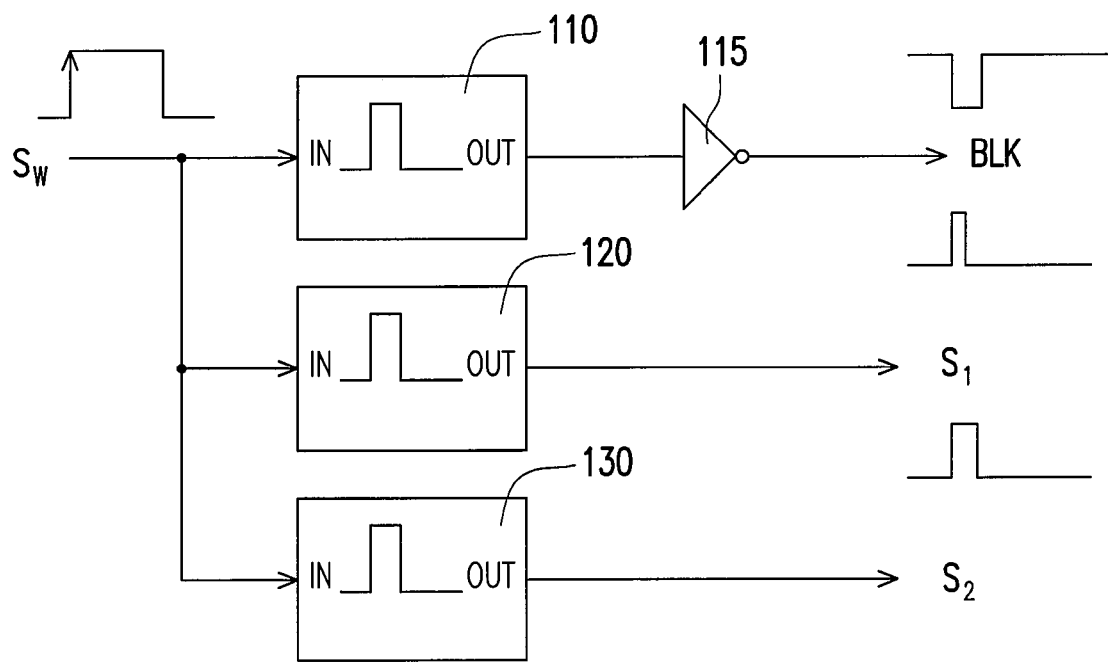
FIG. 4 is a view of a signal generation circuit according to an embodiment of the present invention.

FIG. 4 shows the signal generation circuit 100. The switching signal $S_W$ is coupled to the input of pulse generators 110, 120 and 130. The pulse generator 110 generates the blanking signal BLK through an inverter 115. Pulse generators 120 and 130 generate the sample signals $S_1$ and $S_2$ respectively. The blanking signal BLK and sample signals $S_1$, $S_2$ are thus generated in response to the enabling of the switching signal $S_W$. The sample signal $S_1$ is a pulse signal with a first period $T_1$. The sample signal $S_2$ is a pulse signal with a second period $T_2$. The pulse width of the blanking signal BLK is longer than the pulse width of the sample signal $S_2$. The pulse width of the sample signal $S_2$ is longer than the pulse width of the sample signal $S_1$.

Figure 5:
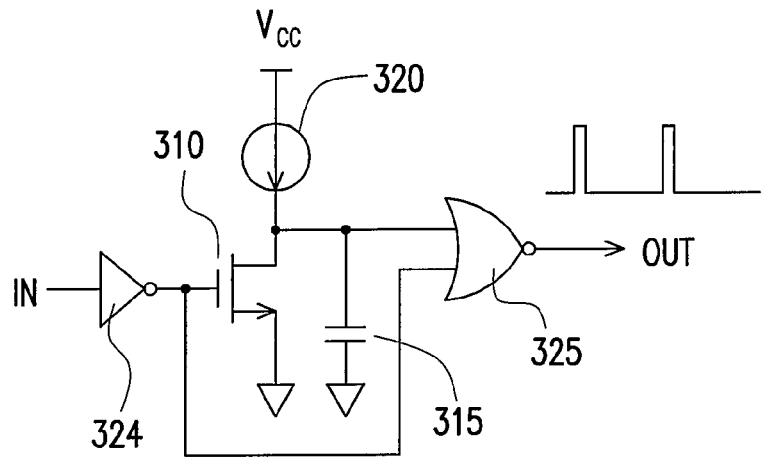
FIG. 5 is a circuit diagram of a pulse generator.

FIG. 5 shows the circuit of pulse generators. A constant current-source 320, a transistor 310, a capacitor 315, an inverter 324, and an NOR gate 235 develop the pulse generator to generate an output pulse signal OUT in response to the rising edge of an input signal IN. The current of the constant current-source 320 and the capacitance of the capacitor 315 determine the pulse width of the output pulse signal OUT.

Figure 6:
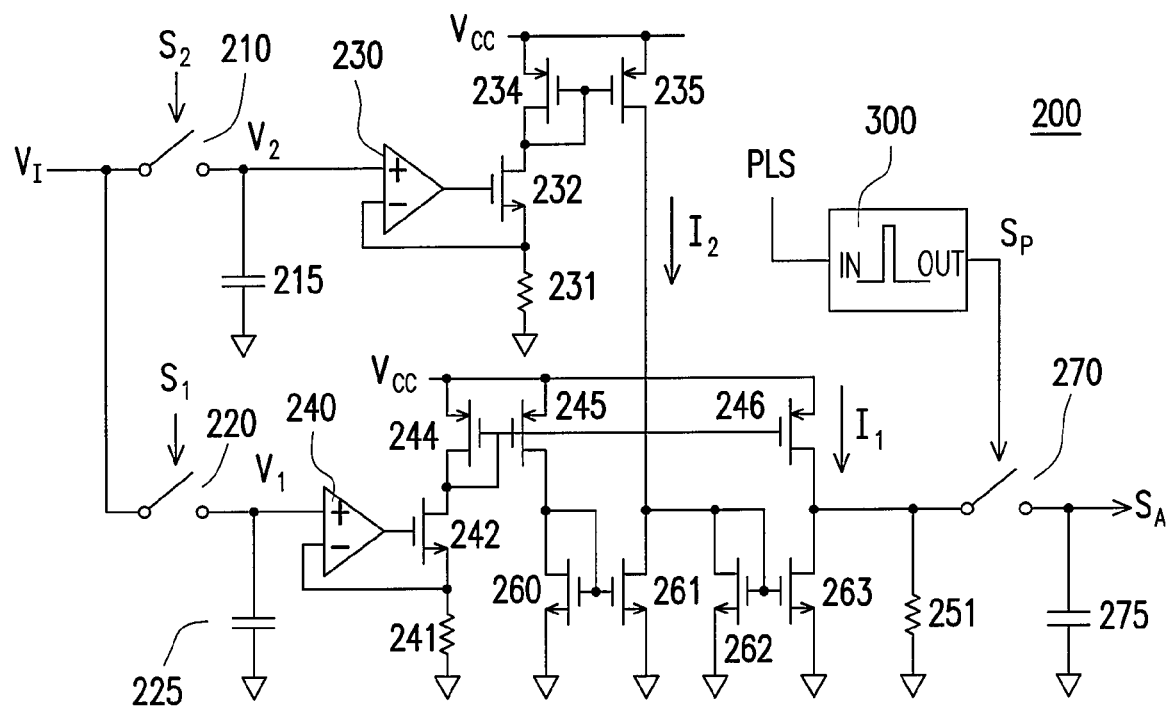
FIG. 6 is a view of a detection circuit according to an embodiment of the present invention.

FIG. 6 is a view of the detection circuit 200 according to an embodiment of the present invention. A capacitor 215 is coupled to receive the current signal $V_I$ though a switch 210. A capacitor 225 is coupled to receive the current signal $V_I$ though a switch 220. The switch 220 is controlled by the sample signal $S_1$. The switch 210 is controlled by the sample signal $S_2$. The capacitor 225 is therefore coupled to sample-and-hold the current signal $V_I$ to generate a signal $V_1$ during the first period $T_1$ after the enabling of the switching signal $S_W$. The capacitor 215 is coupled to sample-and-hold the current signal $V_I$ to generate a signal $V_2$ during the second period $T_2$ after the enabling of the switching signal $S_W$. An operational amplifier 230, a transistor 232 and a resistor 231 form a voltage-to-current converter to generate a current $I_{232}$ according to the signal $V_2$. Transistors 234 and 235 develop a first current mirror to generate a current signal $I_2$ according to the current $I_{232}$.

An operational amplifier 240, a transistor 242 and a resistor 241 form another voltage-to-current converter to generate a current $I_{242}$ according to the signal $V_1$. Transistors 244, 245 and 246 develop a second current mirror to generate a current signal $I_1$ and a current $I_{245}$ according to the current $I_{242}$. Transistors 260 and 261 form a third current mirror to receive the current $I_{245}$ and generate a current $I_{261}$. The magnitude of the current $I_{261}$ is designed same as the magnitude of the current signal $I_1$. The transistor 261 is further coupled to receive the current signal $I_2$ to generate a delta signal according to the differential of the first current signal $I_1$ and the second current signal $I_2$. Transistors 262 and 263 develop a fourth current mirror to receive the delta signal and generate a current $I_{263}$. The transistor $I_{263}$ is further coupled to receive the current signal $I_1$. The current signal $I_1$ and the current $I_{263}$ produce a differential signal coupled to a resistor 251 to generate a voltage signal $V_{251}$. A capacitor 275 is coupled to sample the voltage signal $V_{251}$ through a switch 270 to generate the continuous current signal $S_A$. The switch 270 is controlled by a sample signal $S_P$. The oscillation signal PLS produces the sample signal $S_P$ through a pulse generator 300.

The continuous current signal $S_A$ is therefore generated according to the first current signal $I_1$ and the second current signal $I_2$, in which the continuous current signal $S_A$ is corrected to the continuous current of the switching current $I_P$. The continuous current signal $S_A$ is equal to the first current signal $I_1$ minus the differential of the first current signal $I_1$ and the second current signal $I_2$. It can be shown as, $$S_A = [I_1 - (I_2 - I_1)] \times R_{251} \quad (1)$$

$$S_A = \left[\frac{V_1}{R_{241}} - \left(\frac{V_2}{R_{231}} - \frac{V_1}{R_{241}}\right)\right] \times R_{251} \quad (2)$$

$$S_A = k \times [V_1 - (V_2 - V_1)] \quad (3)$$

wherein $R_{231}$, $R_{241}$ and $R_{251}$ are the resistance of resistors 231, 241 and 251 respectively and k is a constant.

Figure 7:
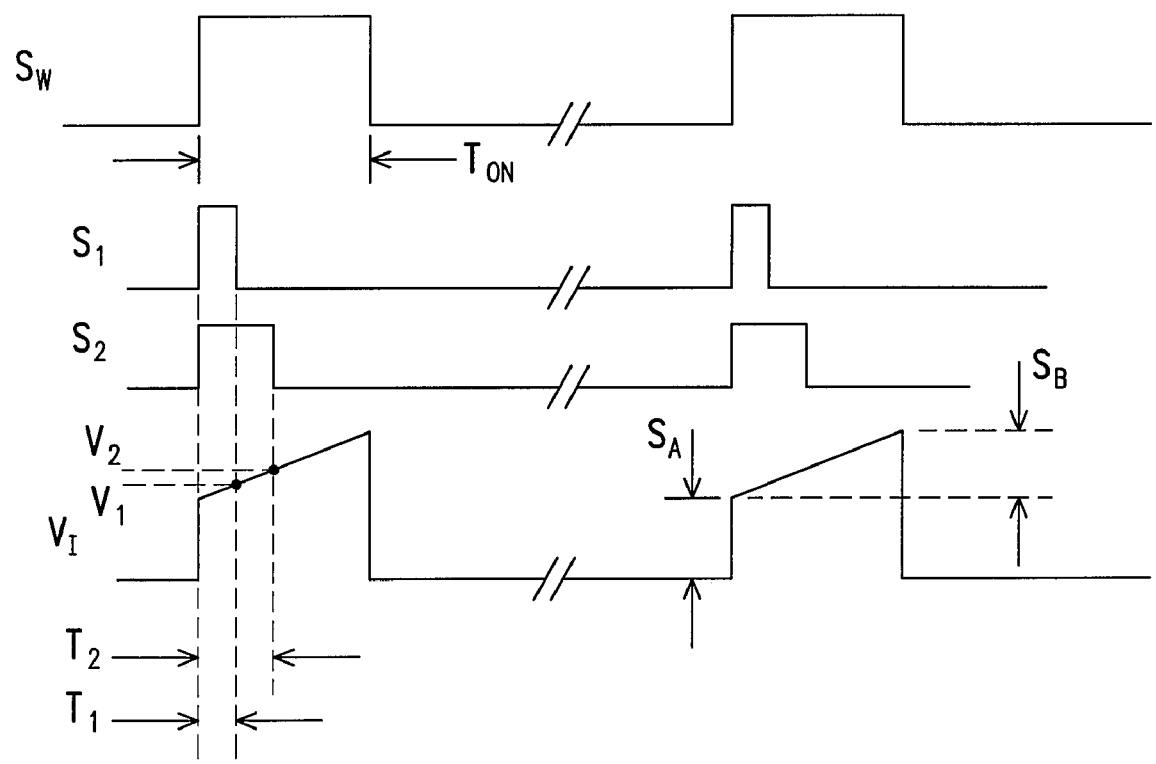
FIG. 7 shows signal waveforms of the controller according to an embodiment of the present invention.

FIG. 7 shows signal waveforms. The signal generation circuit 100 generates sample signals $S_1$ and $S_2$ in response to the switching signal $S_W$. The sample signal $S_1$ includes the first period $T_1$. The sample signal $S_2$ has the second period $T_2$. The detection circuit 200 samples the current signal $V_I$ during the first period $T_1$ to generate the signal $V_1$. Sampling the current signal $V_I$ during the second period $T_2$ generates the signal $V_2$. The continuous current signal $S_A$ is determined according to the signal $V_1$ and $V_2$.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. An apparatus for detecting a continuous current of a switching current, comprising:
   a switching control circuit, for generating a switching signal to switch a magnetic device;
   a current sense circuit, for generating a current signal in response to a switching current of the magnetic device;
   a signal generation circuit, for generating a first sample signal and a second sample signal; and
   a detection circuit, coupled to the current signal to generate a first current signal and a second current signal in response to the first sample signal and the second sample signal respectively, wherein the detection circuit generates a continuous current signal according to the first current signal and the second current signal, and wherein the continuous current signal is corrected to the continuous current of the switching current,
   wherein a pulse width of the second sample signal is longer than a pulse width of the first sample signal, wherein the first sample signal and the second sample signal are generated in response to an enabling of the switching signal.

2. An apparatus for detecting a continuous current of a switching current, comprising:
   a switching control circuit, for generating a switching signal to switch a magnetic device;
   a current sense circuit, for generating a current signal in response to a switching current of the magnetic device;
   a signal generation circuit, for generating a first sample signal and a second sample signal; and
   a detection circuit, coupled to the current signal to generate a first current signal and a second current signal in response to the first sample signal and the second sample signal respectively, wherein the detection circuit generates a continuous current signal according to the first current signal and the second current signal, and wherein the continuous current signal is corrected to the continuous current of the switching current,
   wherein the continuous current signal is equal to the first current signal minus a differential between the first current signal and the second current signal.

3. The apparatus as claimed in claim 1, wherein the switching signal includes an on time with a minimum value.

4. The apparatus as claimed in claim 1, wherein the detection circuit comprises:
   a first capacitor, coupled to sample-and-hold the current signal through a first switch during an enabling of the first sample signal;
   a second capacitor, coupled to sample-and-hold the current signal through a second switch during an enabling of the second sample signal; and
   a third capacitor, coupled to sample-and-hold the continuous current signal, wherein the first capacitor is coupled to generate the first current signal, the second capacitor is coupled to generate the second current signal, a delta signal is generated according to a differential between the first current signal and the second current signal, and the continuous current signal is generated according to the first current signal and the delta signal.

5. A method for detecting a continuous current of a switching current, comprising:
   generating a switching signal to switch a magnetic device;

generating a current signal in response to a switching current of the magnetic device;

sampling a waveform of the current signal in response to an enabling of the switching signal to generate a first current signal and a second current signal; and generating a continuous current signal according to the first current signal and the second current signal, wherein the continuous current signal is corrected to the continuous current of the switching current, wherein the continuous current signal is equal to the first current signal minus the differential between the first current signal and the second current signal.

6. The method as claimed in claim 5, wherein a first sample signal and a second sample signal are generated to sample the first current signal and the second current signal respectively, and a pulse width of the second sample signal is longer than a pulse width of the first sample signal.

7. The method as claimed in claim 5, wherein the switching signal including an on time with a minimum value.

8. The apparatus as claimed in claim 2, wherein the first sample signal and the second sample signal are generated in response to an enabling of the switching signal, and a pulse width of the second sample signal is longer than a pulse width of the first sample signal.

9. The apparatus as claimed in claim 2, wherein the switching signal includes an on time with a minimum value.

10. The apparatus as claimed in claim 2, wherein the detection circuit comprises:

a first capacitor, coupled to sample-and-hold the current signal through a first switch during an enabling of the first sample signal;

a second capacitor, coupled to sample-and-hold the current signal through a second switch during an enabling of the second sample signal; and a third capacitor, coupled to sample-and-hold the continuous current signal, wherein the first capacitor is coupled to generate the first current signal, the second capacitor is coupled to generate the second current signal, a delta signal is generated according to a differential between the first current signal and the second current signal, and the continuous current signal is generated according to the first current signal and the delta signal.

* * * * *